June 27, 1967 B. TOPAS 3,328,213

METHOD FOR GROWING SILICON FILM

Filed Nov. 26, 1963

INVENTOR.
BENJAMIN TOPAS

BY

OSTROLENK, FABER, GERB & SOFFEN
ATTORNEYS

United States Patent Office
3,328,213
Patented June 27, 1967

3,328,213
METHOD FOR GROWING SILICON FILM
Benjamin Topas, Santa Monica, Calif., assignor to International Rectifier Corporation, El Segundo, Calif., a corporation of California
Filed Nov. 26, 1963, Ser. No. 325,874
2 Claims. (Cl. 148—175)

This invention relates to a novel process for the growth of silicon films on a silicon substrate, and more specifically relates to a novel process wherein the surface of the substrate is initially converted to the conductivity type of the film to be deposited.

The epitaxial deposition of semiconductor materials such as silicon is well known to the art. Generally, with this process, a silicon halide gas is reduced by hydrogen in the presence of a silicon substrate, whereupon the silicon produced by this reaction deposits out and bonds to the silicon substrate. Where the silicon substrate is of one of the conductivity types, and the film to be deposited is to have the other of the conductivity types to form a junction between the two, the standard practice has been to introduce a doping agent which carries elements of the other conductivity type with the silicon being deposited, thereby forming the desired conductivity type for the deposited layer.

The present invention recognizes that in the reaction occurring during the growing process of the deposited film, doping agents of the substrate will be removed into the ambient atmosphere. By way of example, and assuming that it is desired to grow an N-type layer on a P-type substrate, during the reaction, P-type particles of the substrate will be removed from the substrate and contaminate the atmosphere. During the growth or deposition process, these P-type contaminants, along with the controlled N-type contaminants introduced with the reacting gas, will now be deposited in the grown layer. Therefore, the desired concentration of doping agents within the grown layer is upset and the desired surface resistance of the layer are varied in an uncontrollable manner.

In accordance with the present invention, this uncontrollable factor is avoided by converting the substrate surface to the desired conductivity type prior to the epitaxial deposition process. Once this is accomplished, the epitaxial growing process proceeds with or without the need for introducing the desired doping agent along with the reacting gases, whereby during the growth process, the desired doping agents in the substrate are released to the atmosphere to be redeposited during the growing cycle. If desired, additional doping agents may be introduced with the reacting gas, it being specifically noted that the particles being released from the substrate during the growth process are of the proper conductivity types and will not contaminate the doping gas.

Accordingly, a primary object of this invention is to provide a novel epitaxial growth technique which permits greater growth control of the characteristics of film being grown.

Another object of this invention is to convert the substrate upon which a film is to be deposited to the conductivity type desired in the ultimately deposited film.

A further object of this invention is to provide a more controllable epitaxial growth technique.

These and other objects of this invention will become apparent from the following description when taken in connection with the drawings, in which.

Figure 1:
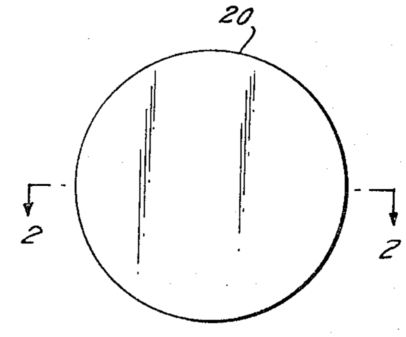
FIGURE 1 is a top view of a typical wafer of monocrystalline silicon material which is shown as being of the N-type.
Figure 2:
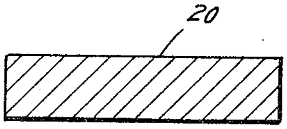
FIGURE 2 is a cross-sectional view of FIGURE 1 when taken across the lines 2—2 in FIGURE 1.
Figure 3:
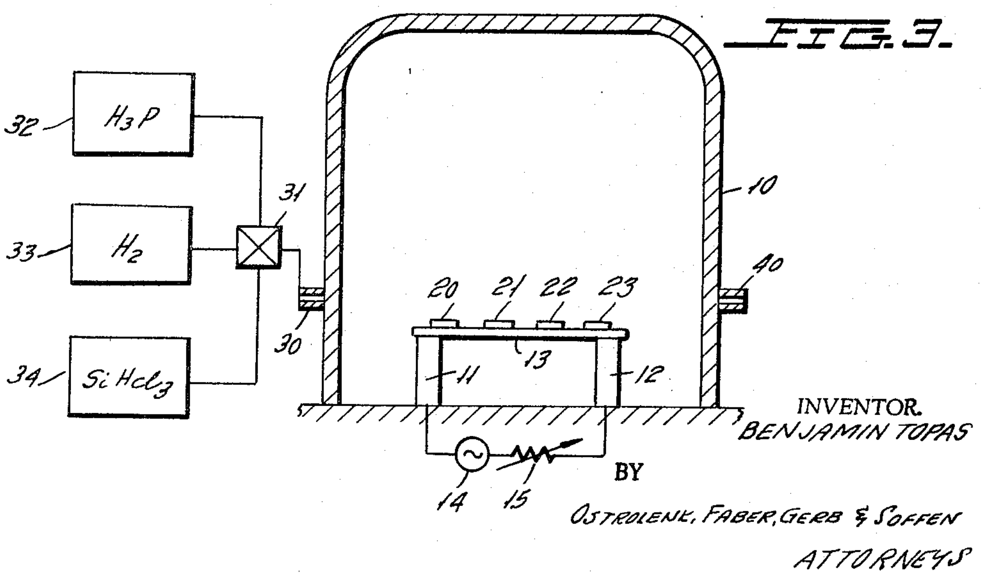

FIGURE 3 schematically illustrates the placement of a plurality of wafers of the type shown in FIGURES 1 and 2 within a reaction chamber of a type suitable for use with epitaxial deposition techniques.

Figure 4:
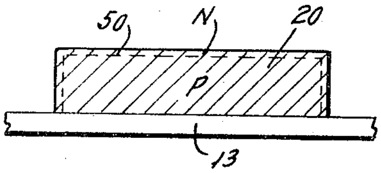

FIGURE 4 is a cross-sectional view of the wafer of FIGURE 2 carried on a graphite heating strip after the initial conversion of the upper surface of the silicon wafers to the other of the conductivity types of the lower surface of the wafer.

Figure 5:
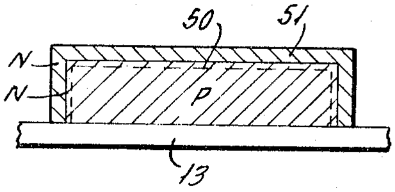

FIGURE 5 is a cross-sectional view of the wafer of FIGURE 4 after the formation of an epitaxially grown layer on the wafer.

Referring first to FIGURES 1 and 2, I have schematically illustrated therein a wafer of semiconductor material such as silicon which is of the P-type conductivity. The wafer of FIGURES 1 and 2 may or may not have one or more junctions preformed therein by any desired technique, it only being necessary for purposes of illustration of the invention to assume that the exposed surfaces of the wafer which are to receive an epitaxially grown layer are of the P-type which has a resistivity, for example, of 20 ohm centimeters. For further purposes of illustration, the wafer of FIGURES 1 and 2 could have a thickness of 14 mils and a diameter of 812 mils.

A plurality of wafers of this type are then to have an N-type layer grown thereon by epitaxial growth techniques for the formation of a desired end product. For this purpose, a plurality of wafers of the type shown in FIGURES 1 and 2 are placed in a suitable reaction chamber of the type shown in FIGURE 3.

Referring to FIGURE 3, the schematically illustrated reaction structure includes an enclosing chamber 10 of some suitable material such as quartz which contains therein a pair of pedestals 11 and 12 which carry a graphite strip heater 13. A suitable source of electric power 14 which is controllable by an adjustable resistance or other suitable control means 15 is then connected in series with strip 13 as by through appropriate electrical conductors extending through pedestals 11 and 12. If desired, the graphite strip heater may be initially processed as described in my copending application Ser. No. 244,624, now U.S. Patent No. 3,140,499, filed Dec. 14, 1962, entitled "Formation of Semiconductor Devices by Epitaxial Deposition," and assigned to the assignee of the present invention. That is to say, the graphite strip 13 may be suitably acted upon so that wafers laid thereon will not stick to the heater after the deposition process is finished.

A plurality of wafers such as wafers 20, 21, 22 and 23 are then laid atop heater 13, each of wafers 20 through 23 being of the type shown in FIGURES 1 and 2. The chamber 10 is then provided with suitable inlet conduits such as conduit 30 which is connected, through a suitable mixing chamber 31, to three or more gas sources such as sources 32, 33 and 34 which are sources of $H_3P$, $H_2$, and $SiHCl_3$ respectively.

In a typical embodiment of the process of the present invention, hydrogen is first introduced into conduit 30 and flows through chamber 10 to the outlet conduit 40. This process which serves to purge the chamber and provide a hydrogen atmosphere proceeds, typically, for approximately 10 minutes with a flow rate of 6 liters per minute. During this process, the heater 13 is excited from source 14 to raise the temperature within chamber 10 to approximately 1200° C. After this flushing operation, $H_3P$ (phosphene) is caused to flow from chamber 32 into chamber 10 and out exhaust 40 at a suitable rate, for example, 40 cc. per minute where the phosphine concentration is 1%. This flow continues for approximately 4 minutes, whereupon phosphorous is deposited on the exposed surfaces of wafers 20 through 23 and is diffused into the surfaces of the wafers to convert the respective surfaces to the N-type conductivity.

Thus, as shown in FIGURE 4, the wafer such as the wafer 20 which is of the P-type now has its exterior exposed surface converted to the N-type to form a junction 50. The N-type film is extremely thin and is of the order of microns. The depth depends upon the desired resistivity and impurity gradient of the final structure. Thus, in the case of a controlled rectifier where there is usually between 1.5 and 2 mils of P-type material between the N-type semiconductor material, the thin film of N-material need not be greater than 1 micron.

After deposition of the thin film, the silicon trichlorosilane from source 34 and the hydrogen from source 33 is introduced into chamber 10 with the upper surface of wafers 20 through 23 being at approximately 1200° C. Typically, about 1 gram per minute of silicon trichlorosilane and 6 liters per minute of hydrogen are introduced during this time whereupon the reaction between the two gases causes the deposition of silicon on wafers 20 through 23.

Accordingly, as seen in FIGURE 5, a layer 51 of silicon would be epitaxially deposited on the substrate or wafer 20.

In accordance with the present invention, it is desirable not to use halogen-type doping agents, inasmuch as these would etch the substrate material. Instead, where P-type doping is desired, diborane ($H_2B_6$) is used as the doping agent or, in N-type doping, phosphene ($H_3P$) is used.

By converting the surface of the substrate to the conductivity type to be deposited, the tendency of having material of the opposite conductivity mixed with the doping gas is greatly minimized and substantially overcome. Thus, where it is desired to deposit an N-type layer on a P-type substrate, the acceptors from the N-type silicon would mix with the doping gas and change the resistivity of the N-type deposited layer. However, by converting a thin surface film to N-type through the introduction of phosphene prior to the actual silicon deposition, contamination of the doping gas is greatly minimized.

In a process which involves the deposition of N-type silicon on P-type silicon, the steps would, therefore, involve first, the passage of hydrogen over the substrate, then the use of a mixture of hydrogen and phosphene, and finally, hydrogen and phosphene and trichlorosilane. The concentration of trichlorosilane should generally not exceed 0.3 molar as too great an etch would be obtained above this value, and is generally of the order of 0.1 molar. The concentration of phosphene is about 1%.

Instead of trichlorosilane, other halogenated silanes such as tetrachlorosilane or silane per se may be used. The trichlorosilane effectively removes the thin film and deposits fresh N-type silicon on the substrate.

In the epitaxial deposition process, the silicon is deposited until the desired thickness of layer 51 is achieved. For example, where it is desired to have a thickness of 1 to 2 mils, the epitaxial deposition process proceeds for 12 to 24 minutes. Once the desired layer thickness is achieved, the silicon elements are cooled in hydrogen for several minutes and the chamber 10 is then flushed with an inert gas.

Although this invention has been described with respect to its preferred embodiments, it should be understood that many variations and modifications will now be obvious to those skilled in the art, and it is preferred therefore that the scope of the invention be limited not by the specific disclosure herein but only by the appended claims.

The embodiments of the invention in which an exclusive privilege or property is claimed are defined as follows:

1. The method of epitaxially forming a silicon layer on a silicon substrate of one of the conductivity types which includes the steps of placing said substrate in a controlled atmosphere container, applying carriers of the other of the conductivity types to the surface of said substrate and heating said substrate to diffuse said carriers of the other of the conductivity types into said substrate for a depth of approximately 1 micron, and thereafter directing a halogenated silicon gas and a gas including carriers of said other of said conductivity types to said substrate and reducing said gases to epitaxially deposit a layer of silicon having said carriers of said other of said conductivity type therein upon said substrate.

2. The method of epitaxially forming a silicon layer on a silicon substrate of one of the conductivity types which includes the steps of placing said substrate in a controlled atmosphere container, applying carriers of the other of the conductivity types to the surface of said substrate and heating said substrate to diffuse said carriers of the other of the conductivity types into said substrate and thereafter directing a halogenated silane gas and a gas including carriers of said other of said conductivity types to said substrate and reducing said gases to epitaxially deposit a layer of silicon having said carriers of said other of said conductivity type therein upon said substrate.

References Cited

UNITED STATES PATENTS

| | | | |
|---|---|---|---|
| 2,561,411 | 7/1951 | Pfann | 148—1.5 |
| 2,985,804 | 5/1961 | Buie | 148—1.5 |
| 3,031,270 | 4/1962 | Rummel | 148—1.5 |
| 3,089,794 | 5/1963 | Marinace | 148—175 |
| 3,131,098 | 4/1964 | Krsek et al. | 148—175 |
| 3,149,395 | 9/1964 | Bray et al. | 148—175 |

OTHER REFERENCES

Tung: Metallurgy of Semiconductor Materials, vol. 15, Interscience Publishers, Aug. 30–Sept. 1, 1961, pp. 87–102, in particular page 93.

Van Ligten: Disclosure in the IBM Technical publication, vol. 4, No. 10, March 1962, pp. 58 and 59.

DAVID L. RECK, *Primary Examiner.*

BENJAMIN HENKIN, *Examiner.*

N. F. MARKVA, *Assistant Examiner.*

UNITED STATES PATENT OFFICE
CERTIFICATE OF CORRECTION

Patent No. 3,328,213 Dated June 27, 1967

Inventor(s) Benjamin Topas

It is certified that error appears in the above-identified patent and that said Letters Patent are hereby corrected as shown below:

Column 2, line 43, Serial No. "244,624" should be --- 244,66 line 44, "now U.S. Patent No. 3,140,499, filed Dec. 14, 1962, en-" should be --- filed Dec. 14, 1962 (now abandoned), en- ---

Signed and sealed this 14th day of December 1971.

(SEAL)
Attest:

EDWARD M.FLETCHER,JR.
Attesting Officer

ROBERT GOTTSCHALK
Acting Commissioner of Patents